(12) United States Patent
Hao et al.

(10) Patent No.: US 7,685,965 B1
(45) Date of Patent: Mar. 30, 2010

(54) APPARATUS FOR SHIELDING PROCESS CHAMBER PORT

(75) Inventors: Fangli J. Hao, Cupertino, CA (US); John E. Daugherty, Fremont, CA (US); Allan K. Ronne, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 69 days.

(21) Appl. No.: 11/341,079

(22) Filed: Jan. 26, 2006

(51) Int. Cl.
*C23C 16/00* (2006.01)
(52) U.S. Cl. .................................. 118/723 I; 118/723 R
(58) Field of Classification Search ................ 118/723 I, 118/723 R
See application file for complete search history.

(56) References Cited

U.S. PATENT DOCUMENTS

| | | | |
|---|---|---|---|
| 2,637,576 A * | 5/1953 | Nottingham ................. | 292/99 |
| 5,226,967 A | 7/1993 | Chen et al. ................... | 118/723 |
| 5,763,851 A | 6/1998 | Forster et al. .......... | 219/121.43 |
| 6,013,155 A | 1/2000 | McMillin et al. ............. | 156/345 |
| 6,110,287 A | 8/2000 | Arai et al. .................... | 118/723 |
| 6,116,185 A | 9/2000 | Rietzel et al. ............ | 118/723 R |
| 6,230,651 B1 * | 5/2001 | Ni et al. ..................... | 118/723 I |
| 6,251,241 B1 | 6/2001 | Shin et al. .............. | 204/298.11 |
| 6,468,388 B1 | 10/2002 | Hanawa et al. .......... | 156/345.48 |
| 6,500,299 B1 | 12/2002 | Mett et al. ................... | 156/345 |
| 6,551,447 B1 | 4/2003 | Savas et al. ............ | 156/345.48 |
| 6,626,998 B1 * | 9/2003 | Dunham ................. | 118/723 R |
| 6,652,489 B2 * | 11/2003 | Trocki et al. ................ | 604/154 |
| 2003/0184088 A1 * | 10/2003 | Takayanagi et al. ......... | 285/319 |

* cited by examiner

*Primary Examiner*—Ram N Kackar
*Assistant Examiner*—Keath T Chen
(74) *Attorney, Agent, or Firm*—Martine Penilla & Gencarella, LLP

(57) ABSTRACT

A port provides access to a process chamber interior for exemplary gas injection and process analysis and measurement. Centering the port in an external RF coil reduces the strength of an electric field across the port in generating plasma in the chamber. Plasma-induced etching and deposition in a bore of a gas injection injector mounted in the port is reduced by a grounded shield surrounding a region defined by the port, extending the life of the injector and of a chamber window in which the port is provided. The shield surrounds the region, and is configured with a longitudinally-extending slot defining a retainer arm and a flexure junction, and with a retainer foot on the arm. The junction urges the arm to extend the foot into a retainer groove of the port, and flexes to permit foot movement out of the groove in removal of the shield from the port.

10 Claims, 9 Drawing Sheets

APPARATUS FOR SHIELDING PROCESS CHAMBER PORT

BACKGROUND OF THE INVENTION

1. Field of the Invention

The present invention relates generally to semiconductor manufacturing and, more particularly, to apparatus for shielding access openings from electrical fields, wherein the access openings allow access to semiconductor manufacturing chambers, the electric fields are applied to the chambers adjacent to the access openings, and the access openings provide access for exemplary gas injectors and process analysis and measurement tools.

2. Description of the Related Art

Vacuum processing chambers have been used for etching materials from substrates, and for deposition of materials onto substrates, and the substrates have been semiconductor wafers, for example. U.S. Pat. No. 6,230,651 to Ni et al. issued May 15, 2001 and assigned to Lam Research Corporation, the assignee of the present application, is incorporated herein by reference and illustrates an opening, or port, providing access to an interior of such a processing chamber. There, a gas injection system is used with an RF energy source in the form of a coil mounted externally of the chamber on a dielectric window at the top of the chamber. In one embodiment, an injector of the gas injection system was separate, inserted in the port, and sealed. The injector supplied process gas to the chamber. The RF energy from the coil energized the process gas to provide a plasma in the chamber for processing the substrate. For the gas supply, the injector was configured with many gas outlets, including embodiments with eight or nine gas outlets. The gas outlets were located in a region of reduced electric field strength to reduce susceptibility to clogging. Such clogging was related to a thin plasma sheath which could cause electric field lines created by a difference in potential between the plasma and a grounded injector tube.

U.S. Pat. No. 6,013,155 to McMillin et al. issued Jan. 11, 2000, and also assigned to Lam Research Corporation, is incorporated herein by reference and illustrates other openings, or ports, providing access to an interior of such a processing chamber. One showerhead injector described in the McMillin Patent is a composite coaxial structure formed by an inner metallic liner inserted into the interior of a dielectric tube.

These patents improved access to such processing chambers. However, as industry standards have increased, further improvements are required to provide even better access to such processing chambers. For example, in the experience of the applicants of the present application, further improvements are required in each of the elements that provide such access. Such improvements may include port configuration, injector configuration, shield configuration for improved protection from electric fields, and better grounding techniques, for example.

In view of the foregoing, there is a need for apparatus providing further improvements to each of the elements that provide access to processing chambers. Such improvements include port configuration, injector configuration, shield configuration for improved protection from electric fields, and better grounding techniques. Exemplary needs identified by the present applicants include configurations that increase ease of use and reliability of retaining the shield and injector in the port without compromising window structural integrity or the sealing of the injector to the window, for example, while reducing the impact of the electric field on these elements.

SUMMARY OF THE INVENTION

Broadly speaking, embodiments of the present invention fill these needs by providing apparatus that improves each of port configuration, injector configuration, shield configuration for improved protection from electric fields, and grounding techniques. Such apparatus may include configurations of each of the port, injector and shield to increase ease of use and reliability of retaining the shield and the injector in the port without compromising window structural integrity or the sealing of the injector to the window, while reducing the impact of the electric field on these elements.

In one embodiment of the present invention, the sealing is accomplished while allowing each of an injector, a port, and a shield to be configured to cooperate with the other and allow defining of a diameter of a window port to be based only on the sealing aspects of a second shoulder of the injector and on a diameter of a gas bore of the injector.

In another embodiment of the present invention, such sealing is also provided with the shield being as close as possible to the injector. Such close spacing results from a configuration of a shield with dual function slots providing both Faraday shield electric field protection characteristics and more assured retention of the shield and the injector in a port of the window. The injector may also be configured with an outer diameter which is not based on the reception of the injector in the shield. Improved shielding may result from a shield extension that does not move radially and that is configured with a diameter no greater than that required to receive the injector. Similarly, a diameter of the port may have a value no greater than that required to receive the shield. The configurations of the port, the shield, and the injector cooperate to allow the shield to be as close as possible to the injector and the assembled shield and injector to be as far as possible from a coil that induces the electric field.

In one further embodiment an invention is described for apparatus and a system for shielding access openings from electrical fields, wherein the openings allow access to semiconductor manufacturing chambers and the electric fields are applied to the chambers adjacent to openings for access by exemplary gas injectors and process analysis and measurement tools. For a process chamber window in which an access region is defined by a port configured with a retainer groove, the above needs are met by providing a shield for protecting the access region from an electric field that is generated adjacent to the process chamber window. The shield is configured with a longitudinally-extending slot defining a retainer arm and a flexure junction between the retainer arm and a shield member. The retainer arm is configured with a retainer foot. The flexure junction is configured to normally position the retainer arm away from the longitudinal axis to adapt the retainer foot to extend into the retainer groove upon insertion of the shield member into the port. The flexure junction is further configured to permit movement of the retainer arm toward the longitudinal axis to adapt the arm for retainer foot movement out of the retainer groove. This movement permits removal of the shield member from, and insertion of the shield member into, the port.

It will be obvious, however, to one skilled in the art, that embodiments of the present invention may be practiced without some or all of these specific details. In other instances, well known process operations have not been described in detail in order not to obscure the present invention.

BRIEF DESCRIPTION OF THE DRAWINGS

The present invention will be readily understood by the following detailed description in conjunction with the accompanying drawings, and like reference numerals designate like structural elements.

Figure 1:
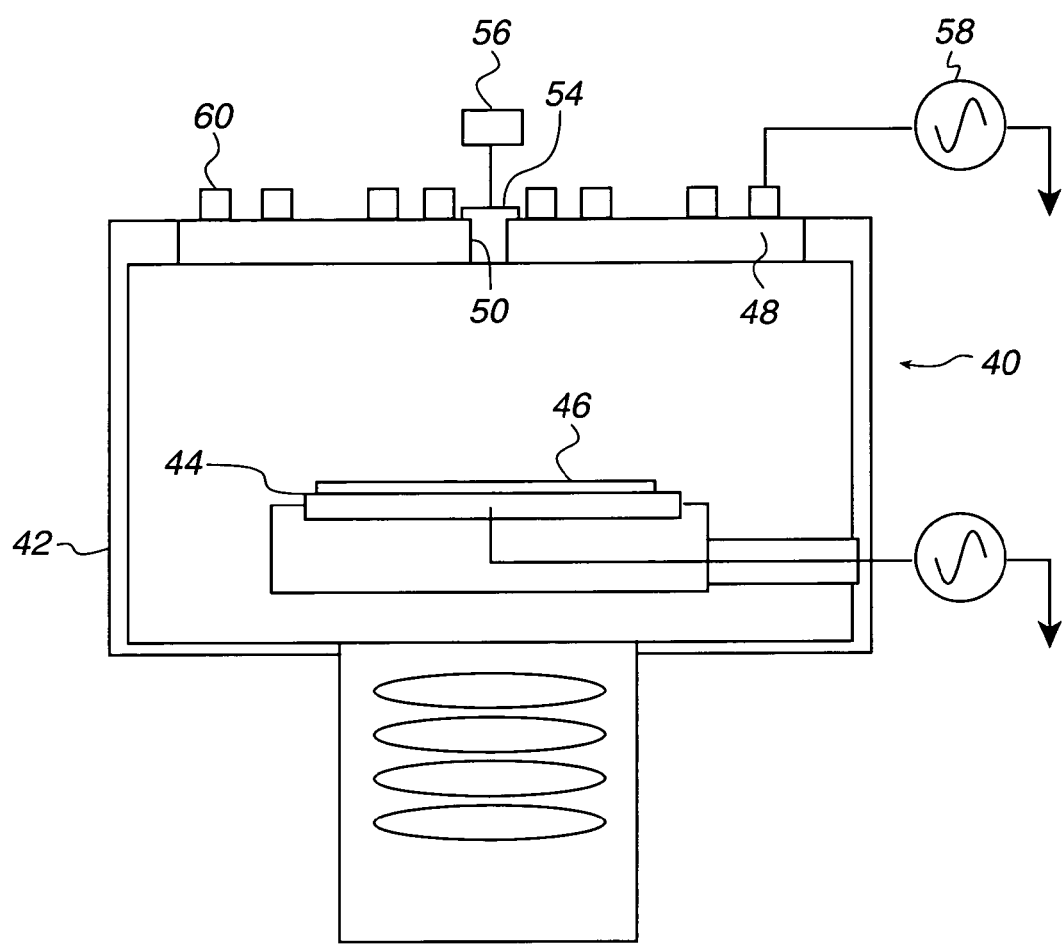
FIG. 1 shows a schematic view of an apparatus of the present invention for shielding access openings from electrical fields.

Other aspects and advantages of the invention will become apparent from the following detailed description, taken in conjunction with the accompanying drawings, illustrating by way of example the principles of embodiments of the invention.

DETAILED DESCRIPTION OF THE PREFERRED EMBODIMENTS

Embodiments of an invention are described for apparatus and a system for shielding access openings from electrical fields, wherein the openings allow access to semiconductor manufacturing chambers. In one embodiment of the present invention, the sealing is accomplished while allowing each of an injector, a port, and a shield to be configured to cooperate with the other and allow defining of a diameter of a window port. Within structural limits of the window, the port diameter is based only on the sealing aspects of a second shoulder of the injector and on a diameter of a gas bore of the injector. In another embodiment of the present invention, such sealing is also provided with the shield being as close as possible to the injector. Such close spacing results from a configuration of a shield with dual function slots providing both Faraday shield electric field protection characteristics and more assured retention of the shield and the injector in a port of the window. The injector may also be configured with an outer diameter which is not based on the reception of the injector in the shield. Unproved shielding may result from a shield extension that does not move radially and that is configured with a diameter no greater than that required to receive the injector. Similarly, within those structural limits, a diameter of the port may have a value no greater than that required to receive the shield. The configurations of the port, the shield, and the injector cooperate to allow the shield to be as close as possible to the injector and the assembled shield and injector to be as far as possible from a coil that induces the electric field.

In a further embodiment, for a process chamber window in which an access region is defined by a port configured with a retainer groove, the above needs are met by providing a shield for protecting the access region from an electric field that is generated adjacent to the process chamber window. The shield is configured with a longitudinally-extending slot defining a retainer arm and a flexure junction between the retainer arm and the shield member. The retainer arm is configured with a retainer foot. The flexure junction is configured to normally position the retainer arm away from the longitudinal axis to adapt the retainer foot to extend into the retainer groove upon insertion of the shield member into the port. The flexure junction is further configured to permit movement of the retainer arm toward the longitudinal axis to adapt the arm for retainer foot movement out of the retainer groove. This movement permits removal of the shield member from, and insertion of the shield member into, the port. It will be obvious, however, to one skilled in the art, that embodiments of the present invention may be practiced without some or all of these specific details. In other instances, well known process operations have not been described in detail in order not to obscure the present invention.

Figure 2A:
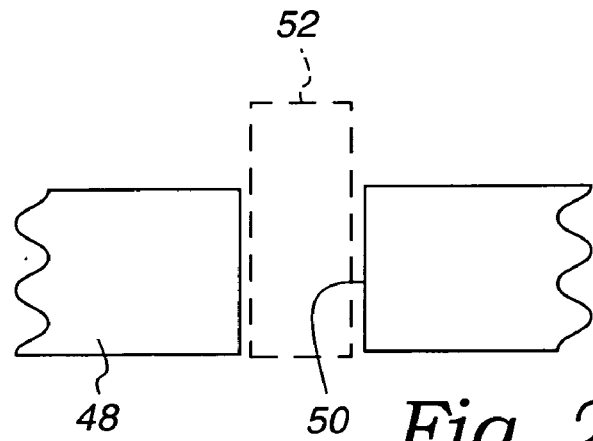
FIG. 2A shows an embodiment of an access region enlarged and extending along an inner wall of a port.

FIG. 1 shows a schematic view of an apparatus 40 of the present invention for shielding access openings from electrical fields. The access openings may allow access to semiconductor manufacturing chambers. The electric fields are applied to the chambers adjacent to access openings for exemplary gas injectors and process analysis and measurement tools. FIG. 1 shows the apparatus 40 including a vacuum processing chamber 42 having a substrate holder 44 providing a suitable clamping force to a substrate 46. The top of the chamber 42 may be provided with a dielectric window 48. An access opening, or port, 50 may be provided in the window 48 to permit access to the interior of the chamber 42. FIG. 2A is an enlarged view showing the port 50 defining a portion of an access region 52, which is illustrated by dashed lines. The port 50 may be cylindrical, for example, in which case the access region 52 is also cylindrical. In the embodiment of the access region 52 shown enlarged in FIG. 2A, the access region 52 extends along the inner wall of the cylindrical port 50. The access region is also shown extending above the window 48. According to the type of window 48 that is to be selected for a particular process to be conducted in the chamber 42, the window may be made from quartz or ceramic, for example.

Figure 2B:
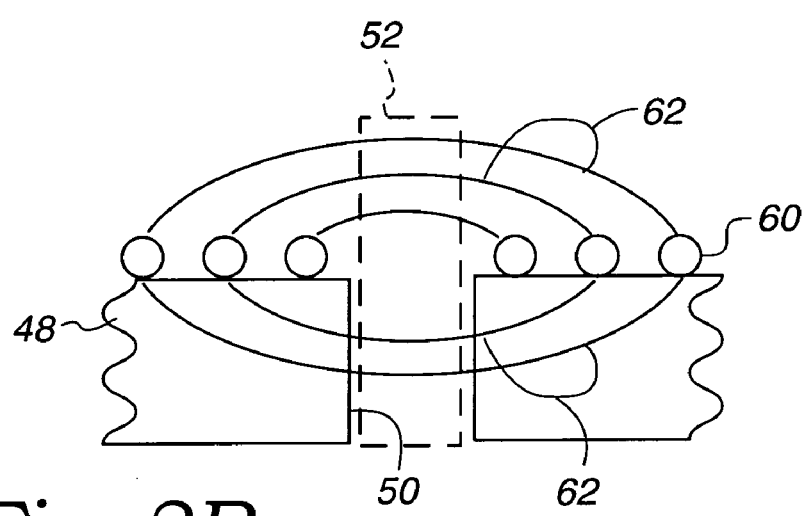
FIG. 2B illustrates the access region, showing that without the present invention an electric field will extend between turns of a coil above the top of a window and through the port.

FIG. 1 shows the chamber 42 provided with facilities 54 that extend through the access region 52. The facilities 54 may provide access to the chamber 42 for process analysis or measurement as described below, or access to the chamber to facilitate conducting deposition or etching processes in the chamber 42. For purposes of description of any use of the port 50 to provide such access, reference is made below to the access region 52, which defines a volume through which the access is provided. As one example, for such processes, process gas may be supplied from a gas supply 56 through the access region 52 into the chamber 42. With a pump (not shown) reducing the pressure in the chamber 42 for the deposition or etching processes, a source 58 of RF energy with an impedance matching circuit is connected to a coil 60 to energize the gas in the chamber and maintain a high density (e.g., $10^{-11}$ to $10^{-12}$ ions/cm3) plasma in the chamber 42. The coil 60 may be the type that inductively couples RF energy into the chamber 42 through the window 48 to provide the high density plasma for conducting the deposition or etching processes in the chamber 42. During that coupling, the coil 60 generates an electric field (see lines 62, FIG. 2B). FIG. 2B shows that without the use of the present invention, the electric field 62 may extend between turns of the coil 60 above the top of the window 48 and through the port 50. This generation of the electric field 62 without the use of the present invention tends to induce an undesired plasma in the access region 52, which region 52 may include a plasma in a bore through which the gas is supplied as described below. This plasma in the bore may result in undesired deposition of particles on various parts within the process chamber 42.

Figure 2C:
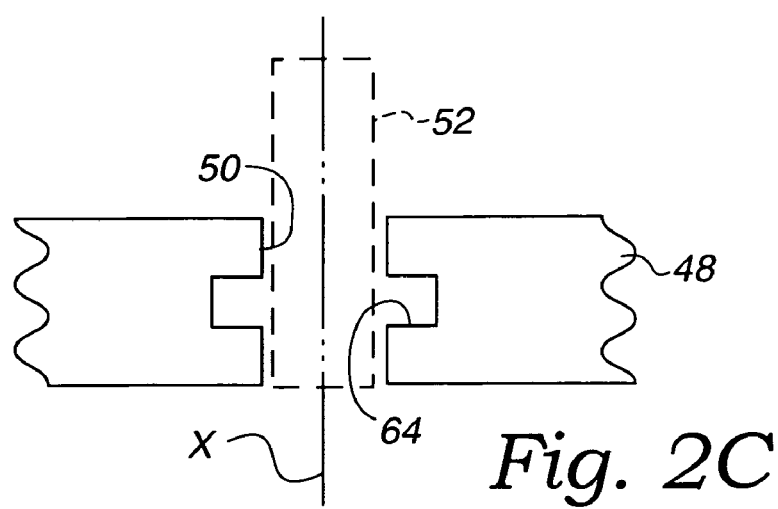
FIG. 2C shows that in one embodiment of the present invention, a process chamber window may include the access region defined by the port, and the port configured with a retainer groove and a longitudinal axis.
Figure 3A:
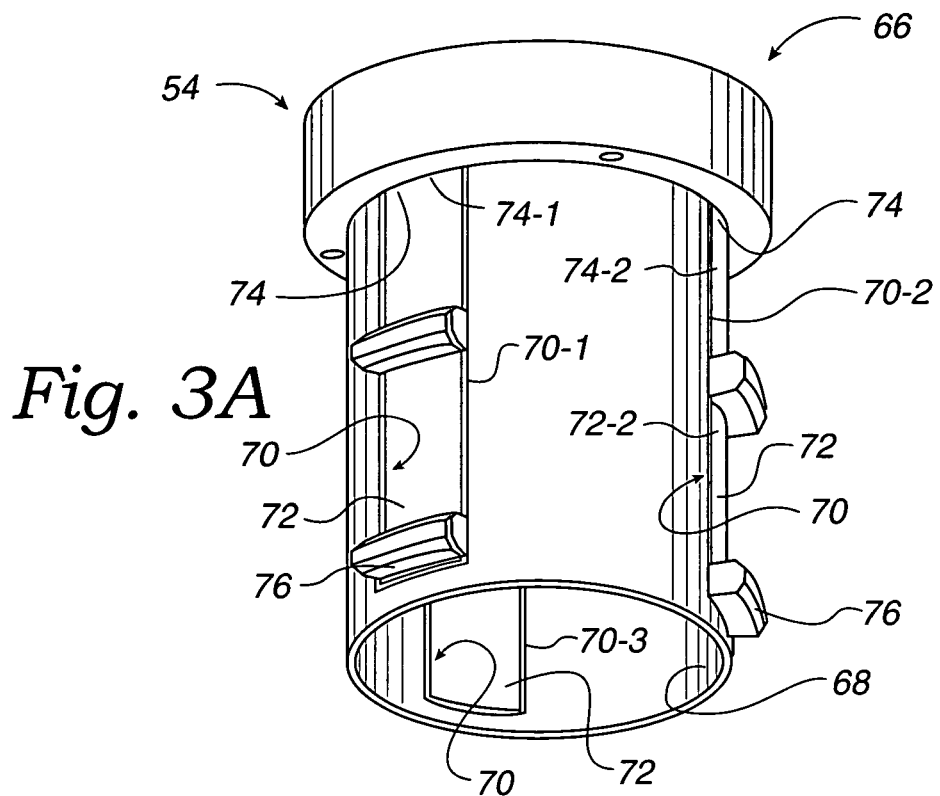
FIG. 3A is an enlarged perspective view of one embodiment of facilities of the present invention that may provide access to the chamber, showing the facilities configured as a shield for protecting the access region.
Figure 3B:
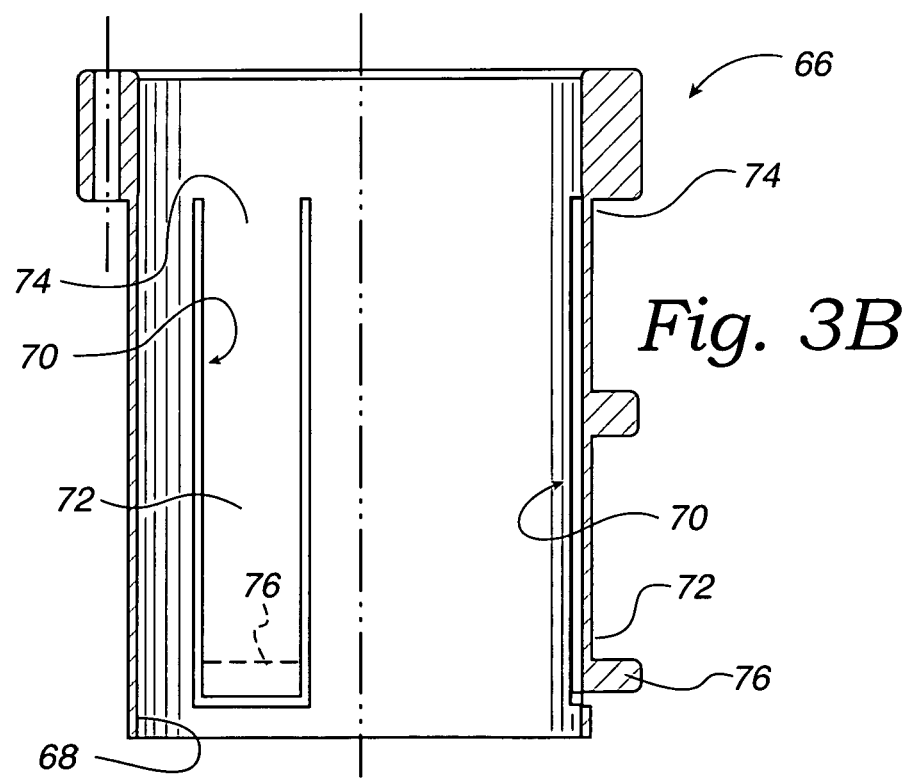
FIG. 3B is a cross sectional view showing the shield configured as a cylindrical shield member with a longitudinally-extending slot.
Figure 3C:
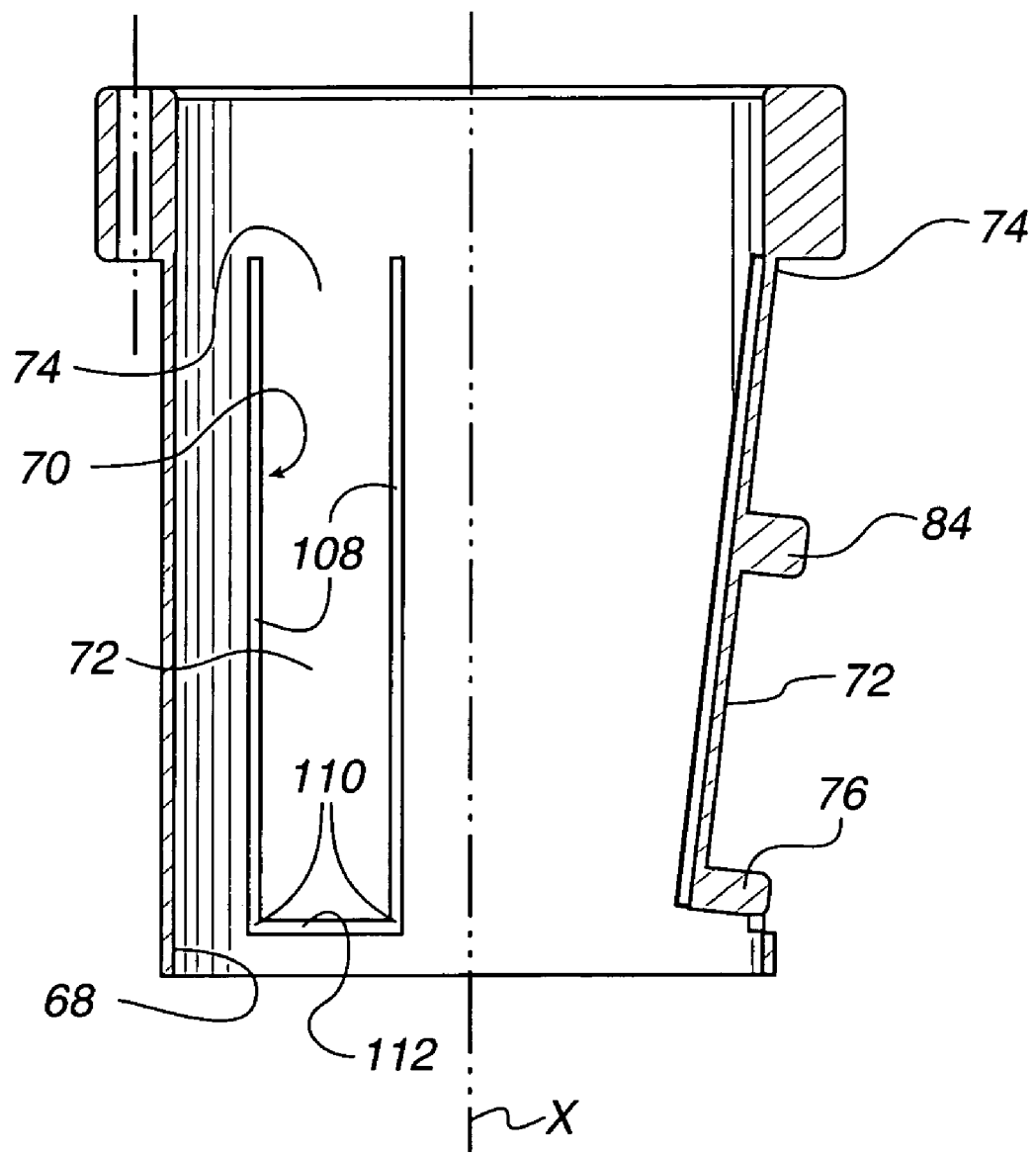
FIG. 3C is a cross sectional view of a flexure junction defined by the slot to permit movement of a retainer arm toward the longitudinal axis.

The facilities 54 of the present invention may be used to substantially avoid the problems caused by such undesired plasma induced in the access region 52, while providing other advantages described below. FIG. 2C is a cross sectional view of the port 50 showing that in one embodiment, the process chamber window 48 may include the access region 52 defined by the port 50 configured with a retainer groove 64, for example. A longitudinal axis X of the port 50 is identified for reference. FIG. 3A is an enlarged perspective view of one embodiment of the facilities 54 showing the facilities configured as a shield 66 for protecting the access region 52. The protection is from the electric field 62 that is generated as described above, which field 62 is shown in FIG. 2B extending adjacent to the process chamber window 48, for example. The shield 66 may be fabricated from material adapted to substantially block the electric field 62 from entering the access region 52. The object of such material and of the other configuration of the shield 66 is to promote an electric field-free condition within the shield. FIG. 3A, and the cross sectional view of FIG. 3B, show the shield 66 configured as a cylindrical shield member 68 with a longitudinally-extending slot 70 defining a retainer arm 72 and a flexure junction 74 between the retainer arm and the shield member. The retainer arm 72 is shown configured with a retainer foot 76. The flexure junction is configured to normally position the retainer arm 72 away from the longitudinal axis X. This is the position shown in FIG. 3B, which adapts the retainer foot 76 to extend into the retainer groove 64 (FIG. 3D) upon insertion of the shield member 68 into the port 50. The flexure junction 74 is further configured to flex and permit movement of the retainer arm 72 toward the longitudinal axis X (into the position of the right hand arm 72 as shown in FIG. 3C). This movement adapts the retainer arm 72 for retainer foot movement out of the retainer groove 64, for example. Such movement permits removal of the shield member 68 from, and insertion of the shield member into, the port 50.

The facilities 54 of the present invention as defined by the embodiment of the shield 66 shown in FIGS. 3A to 3C, may further be described as the slot 70 being configured to define a U-shape. FIGS. 3B and 3C show the retainer arm 72 as being configured within the U of this U-shape, and show the flexure junction 74 being at the open end of the U. FIG. 3A shows an embodiment of the shield 66 in which the slot 70 is a first slot (also identified as 70-1), and the retainer arm 72 is a first arm (identified as 72-1), and the flexure junction 74 is a first flexure junction (identified as 74-1). In this embodiment, the cylindrical shield member 68 is shown further configured with at least one other slot 70 (identified as 70-2), to define at least one other retainer arm (identified as 72-2), and at least one other flexure junction (identified as 74-2) between the at least one other retainer arm 72-2 and the shield member 68. The at least one other arm 72-2 and the at least one other flexure junction 74-2 are respectively configured corresponding to the respective first arm 72-1 and the first flexure junction 74-1. The at least one other retainer arm 72-2 is shown configured with a retainer foot 76-2.

It may be understood from FIGS. 3A through 3C that in other embodiments of the cylindrical shield member 68 the shield member may be further configured with a plurality of the slots 70, in which the plurality is more than two, such as the three shown in FIG. 3A. As a further example of the plurality of slots more than two, the number of such slots 70 may be determined in direct proportion to an amount of the electric field strength. As a first function of the slots 70, each of such plurality of the slots 70 may define one of the arms 72 and one of the flexure junctions 74. One of the retainer feet 76 may be on each of the arms 70. In the three or more arm embodiment, the shield member 68 may be further configured with the slots 70-1, 70-2, 70-3, etc., for example, evenly-spaced around a perimeter of the cylindrical shield member 68. As a second function of the slots 70, the slots 70-1, 70-2, 70-3, etc., in combination with the shield member 68, stop a flow of eddy current that would otherwise cause the shield 66 to heat up in the presence of the electric field 62

Figure 3D:
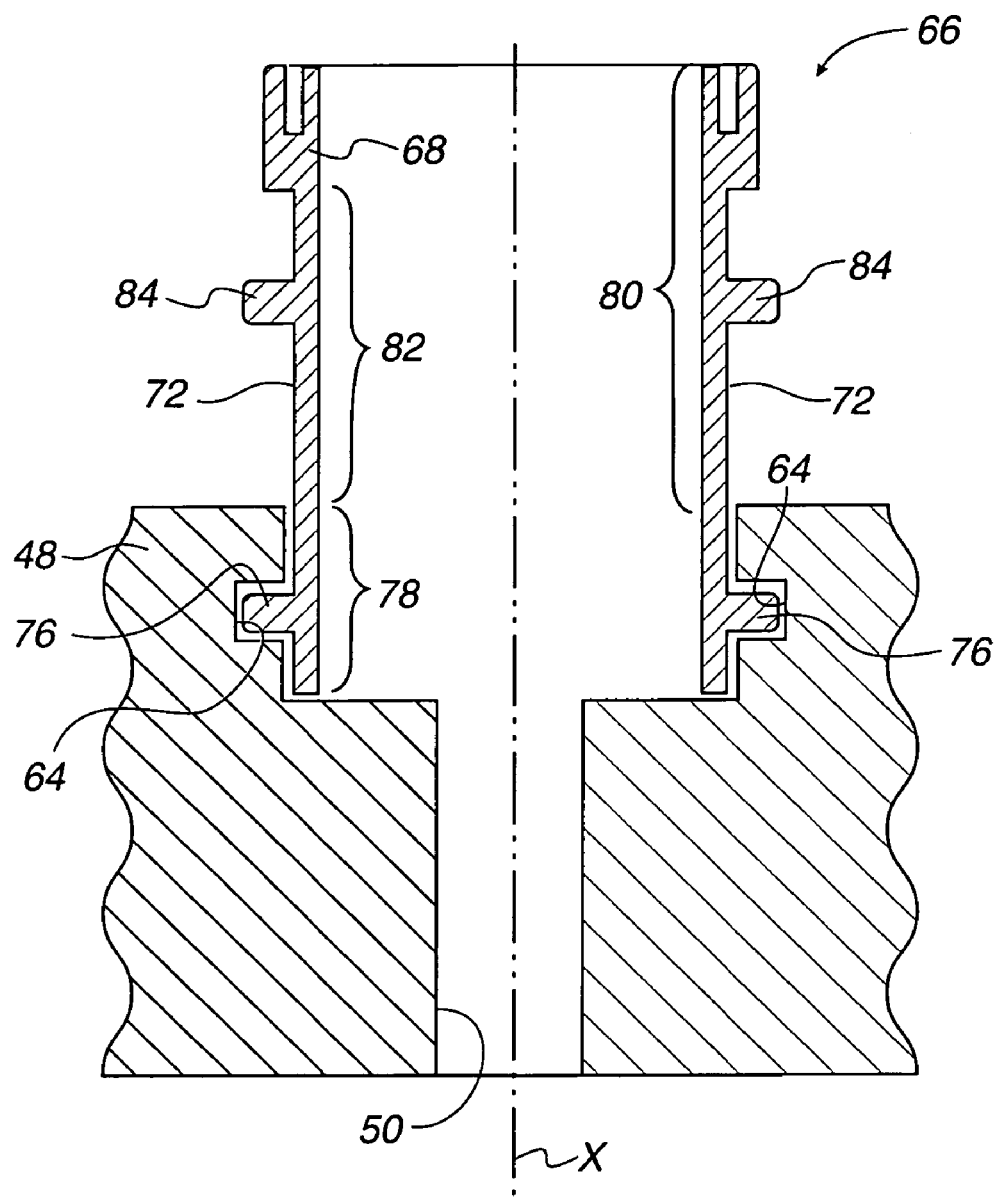
FIG. 3D is a cross sectional view of the shield showing a retainer foot of each arm extending into a groove in the port.

FIG. 3D is a cross sectional view of two of the retainer arms 72, showing that in other embodiments of the cylindrical shield member 68 the shield member may be configured to extend in the direction of the X axis out of the port 50 of the window 48. In one such embodiment, the member 68 is further configured with an internal section (see bracket 78). Here, "internal" refers to that portion of the member 68 that is adapted to be received in the port 50. When the shield member 68 is cylindrical, the internal section 78 is also cylindrical and adapted to be co-extensive with an internal portion of the access region 52. For clarity of illustration, the region 52 is shown only in FIGS. 2A through 2C. The shield member 68 is also configured with a cylindrical projection extension (identified by bracket 80) extending in the direction of the axis X beyond the access region 52. In this embodiment, FIG. 3D shows that an exterior section (identified by bracket 82) of each retainer arm 72 is configured from the projection extension 80 so that the exterior section 82 is exterior of the port 50 when each retainer foot 76 extends into the retainer groove 64. The exterior section 82 of each arm 72 is shown configured with an arm-position control tab 84 extending away from the longitudinal axis X to facilitate flexure of the flexure junction 74. Such flexure may be manual, for example, to move each retainer arm 72 toward the longitudinal axis X (FIG. 3C) and enable insertion of the shield 66 in the port 50, for example. Oppositely, such flexure may allow movement of each retainer arm 72 away from the longitudinal axis X for insertion of the foot 76 in the groove 64 to retain the shield 66 in the port 50.

FIGS. 4A through 4D show other embodiments of the cylindrical shield member 68 of the shield 66. Initially, the shield member 68 shown in FIGS. 4A through 4D may be configured with one or more of the longitudinally-extending slots 70, each defining a respective retainer arm 72 and a respective flexure junction 74 between the retainer arm and the shield member. Each retainer arm 72 is configured with one retainer foot 76 and one tab 84. Each flexure junction 74 is configured to normally position the retainer arm 72 away from the longitudinal axis X (the position shown in FIG. 4C) to adapt the retainer foot 76 to extend into the retainer groove 64 upon insertion of the shield member 68 into the port 50. The flexure junction 74 is further configured to permit movement of the retainer arm 72 toward the longitudinal axis X (into the position of the right arm 72 shown in FIG. 4A) to adapt the retainer arm 72 for retainer foot movement out of the retainer groove 64 to permit removal of the shield member 68 from, and insertion of the shield member into, the port 50.

Figure 4A:
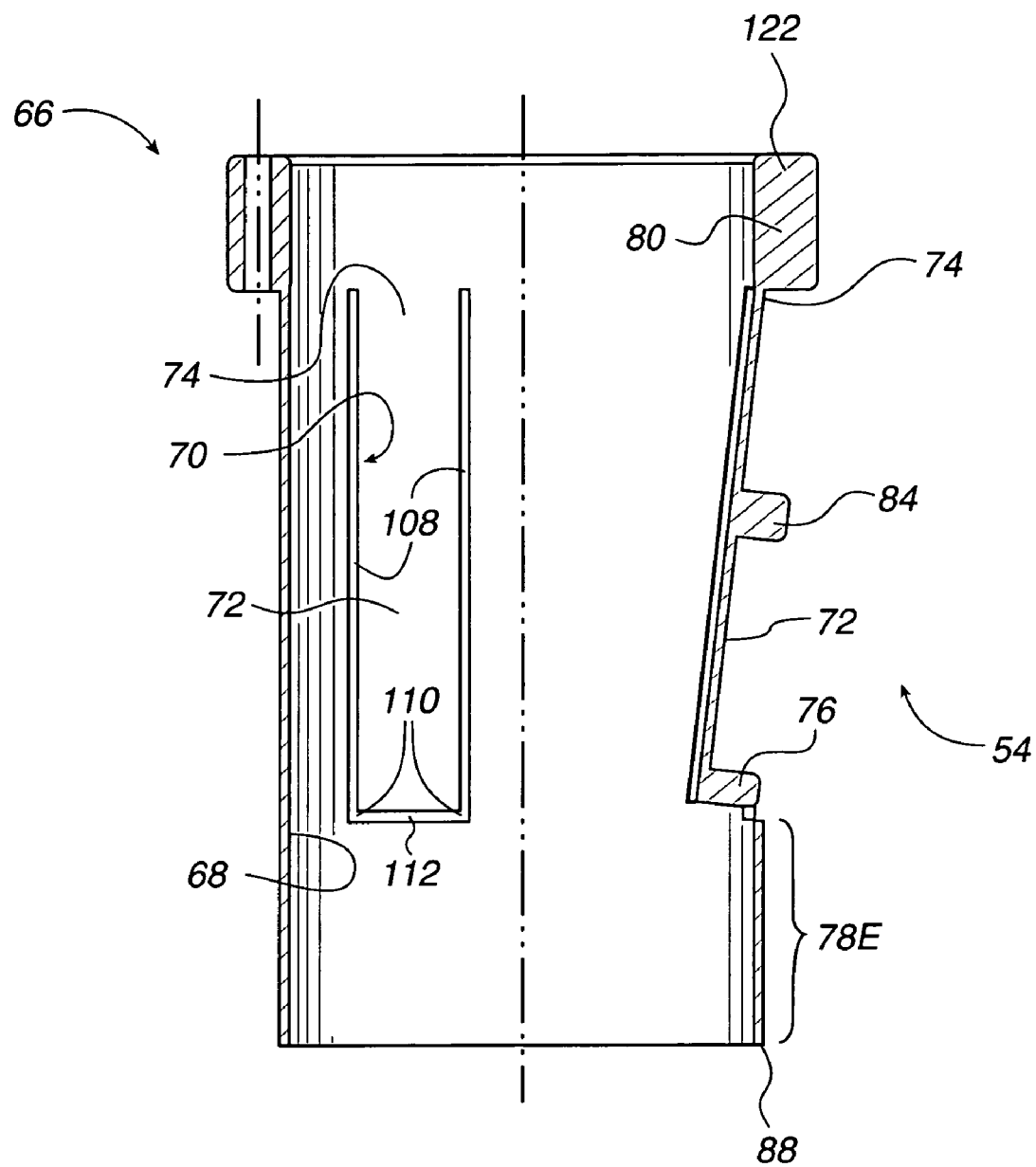
FIG. 4A illustrates another embodiment of the cylindrical shield member configured to extend out of the port in the direction of the longitudinal axis, showing an extension is adapted to extend into the port in the direction of the longitudinal axis.
Figure 4B:
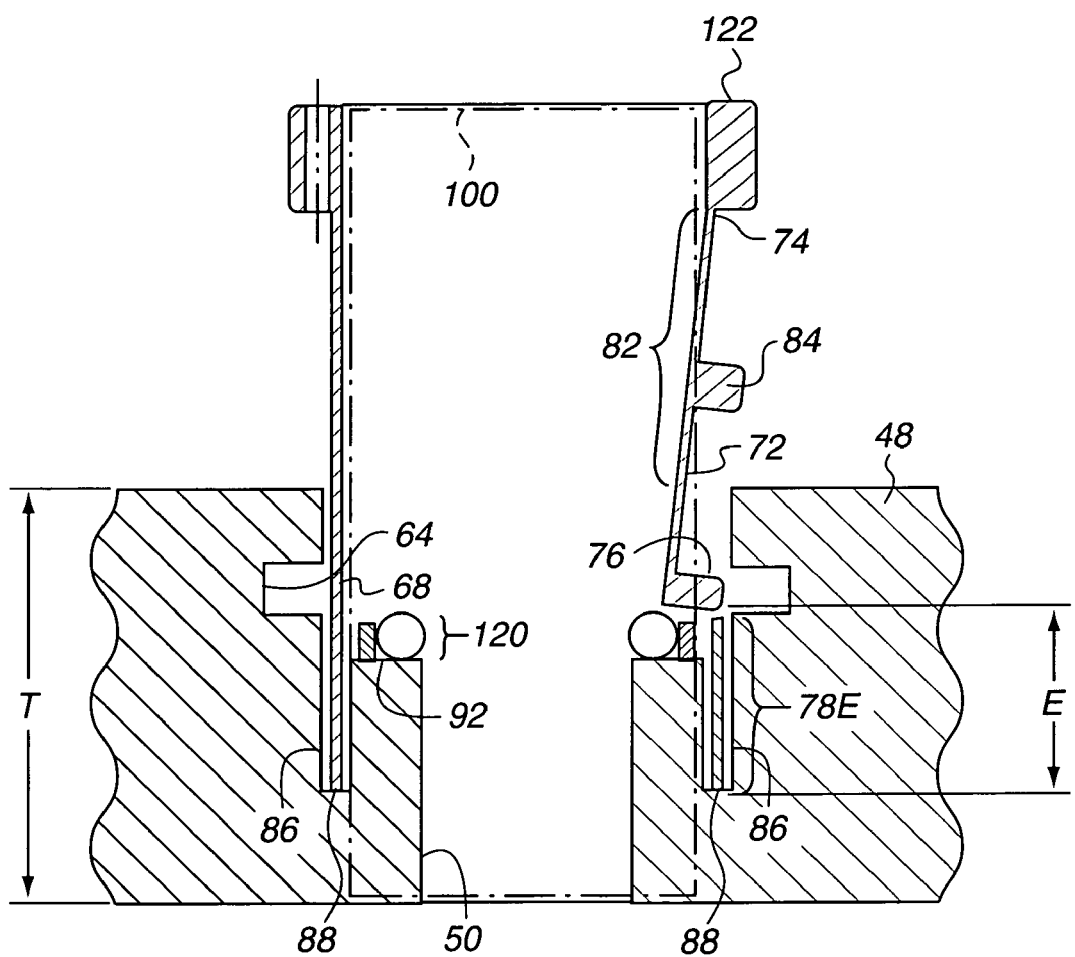
FIG. 4B shows the shield member inserted into the port, and the flexure junction permitting movement of the retainer arm toward the longitudinal axis to permit such insertion into the port.
Figure 4C:
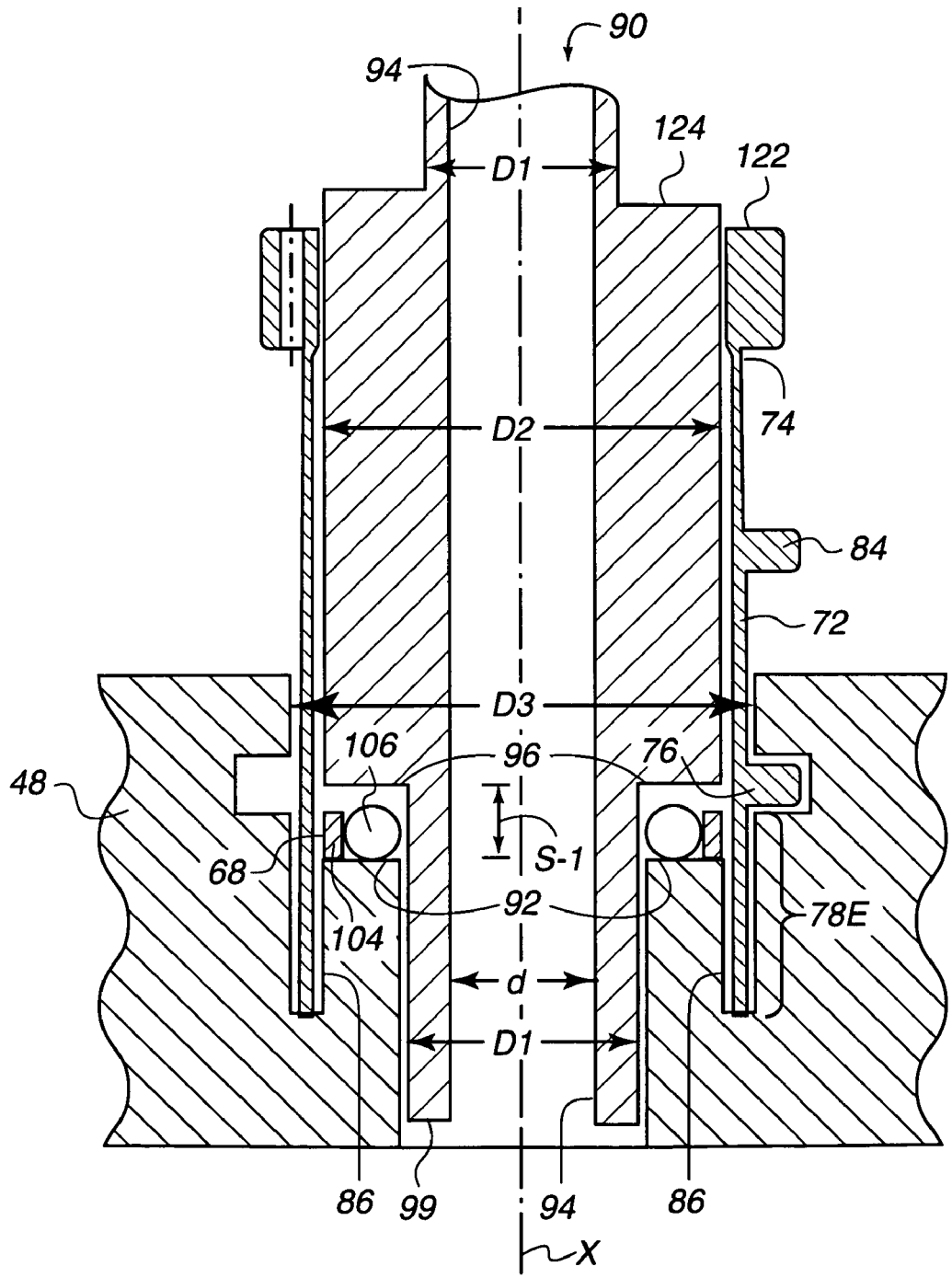
FIG. 4C shows a spacer and an O-ring between a first shoulder and a second shoulder and an injector resting on the O-ring above the spacer.
Figure 4D:
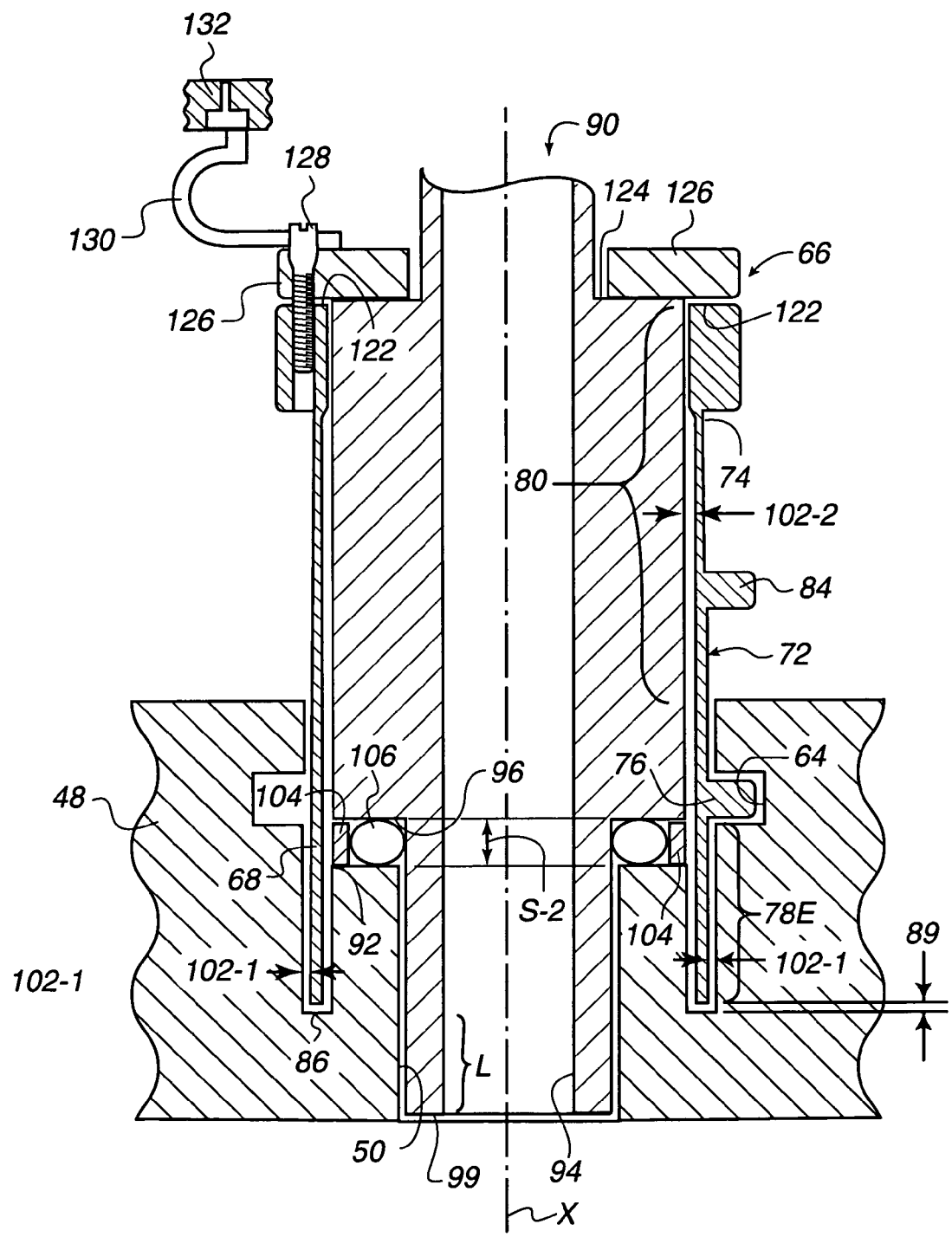
FIG. 4D is a view of an assembled shield and injector, illustrating screws tightened to retain the injector in the port and to deform the O-ring to seal the injector to the port, and a shield cover connected to an electrical ground.

In FIGS. 4A through 4D, the shield member 68 is shown further configured with an internal section 78E. The internal section 78E may be cylindrical and is adapted to be co-extensive with a portion of the access region 52, or an access region 100 described below. FIG. 4B shows that the internal section 78E may be described with respect to the process chamber window 48 configured with a thickness T in the direction of the X axis. The thickness T may be related to a magnitude of processing pressures, for example, and may have exemplary values of from about one inch to about two inches. The process chamber window 48 may be configured with the port 50 having an annular shield slot 86 extending in the direction of the thickness T, i.e., in the direction of the X axis, and past the retainer groove 64, which extending is downwardly as viewed in FIG. 4B. For reception in the shield slot 86, in the embodiment shown in FIGS. 4A through 4D, the internal section 78E (identified by bracket 78E) of the cylindrical shield member 68 is configured to extend in the direction of the X axis past the retainer groove 64, to and into the shield slot 86. FIG. 4B shows the cylindrical shield member 68 configured with a length E defined between a lower part of the retainer foot 76 and a lower end 88 of the cylindrical shield member 68. FIG. 4B also shows the lower end 88 resting on a base of the shield slot 86. In contrast, FIG. 4D shows the lower end 88 separated from the base by a space 89. That resting thus defines a minimum value (of zero) of the space 89 between that lower end 88 and the base of the shield slot 86. It may be understood that the configuration of the slot 86 and of the foot 76 related to the end 88 provide the values of the space 89 and of the length E to allow the cylindrical shield member 68 to move downwardly (as observed in FIG. 4B) so that the retainer foot 76 may approach but not touch the lower wall of the retainer groove 64 when the internal section 78E touches such base of the shield slot 86. In other words, for insertion of the foot 76 in the retainer groove 64 and removal of the foot from the groove, the zero value of the space 89 provides a loose fit between the retainer foot 76 and the walls of the retainer groove 64. This loose fit facilitates the above-described use of the arm-position control tab 84 that extends away from the longitudinal axis X to facilitate flexure of the flexure junction 74 for insertion and removal of the shield relative to the port 50. The lower end 88 resting on the base of the shield slot 86 avoids rubbing of the foot 76 against the walls of the retainer groove 64 for the above-described insertion and removal of the foot, and thus avoids restricting the flexure of the junction 74 under the action of the tab 84. The retainer arm 72 may thus easily move toward the longitudinal axis X (FIG. 4B) and enable insertion of the shield 66 into and removal from the port 50. FIG. 4D shows an assembled configuration of the shield 66, in which the space 89 has an exemplary value of about 0.005 inches between the lower end 88 and the base of the shield slot 86. Also, when the window 48 is made from an exemplary ceramic material, the base of the shield slot 86 may be spaced from the chamber side of the window 48 by about an exemplary ⅓ of the thickness T, and a first seal shoulder 92 may be located at an exemplary midpoint between the external and internal sides of the window 48.

In review, FIG. 1 was described with respect to the chamber 42 provided with the facilities 54 that extend through the access region 52. Those facilities 54 provide access to the chamber 42. Reference was made above to access for process analysis or measurement, and to access to the chamber 42 to facilitate conducting deposition or etching processes in the chamber 42. FIGS. 4C and 4D also show that in other embodiments of the facilities 54, the conducting of deposition or etching processes in the chamber 42 may be facilitated by a gas injector 90 mounted in the port 50. Such other embodiments include the embodiments of the shield 66 shown in FIGS. 4A through 4D, for example. In a general sense, in these embodiments of the present invention, the shield 66 and injector 90 are configured so that the shield 66 is as close as possible to the injector 60, and both are spaced away from the coil 60 as much as possible. The spacing away from the coil is initially facilitated by locating the port 50 at the center of the coil 90. The shield 66 being as close as possible to the injector 90 is as described below.

Referring to the injector 90 as an example of all such ones of the facilities 54, the injector 90 may be configured as an integral part of the window 48. This integral embodiment may be made by molding or machining the window 48, for example. In the embodiment shown in FIGS. 4C and 4D, the injector 90 is shown configured as a separate part of the window 48. In this embodiment the injector may be made from quartz or ceramic, and may also be made by molding or machining processes.

With the injector 90 and window 48 in the exemplary two parts, the port 50 and injector 90 are shown in FIG. 4C configured to be sealed to each other. For this purpose, FIG. 4B shows the port 50 not only configured with the retainer groove 64, but also with the first seal shoulder 92. The first seal shoulder 92 may be provided in an embodiment of the port 50 without the shield slot 86, or in an embodiment of the port 50 with the shield slot 86 as shown in FIG. 4B. The injector 90 is shown in FIG. 4C as a single zone injector, configured with one gas inlet bore 94, and with a second seal shoulder 96. The second seal shoulder 96 is shown having an annular configuration. The injector 90 is further shown in FIG. 4C configured with a thin wall surrounding an internal diameter d of the bore 94. The value of a thickness of the thin wall is related primarily to the pressure of the process gas that is to be admitted to the chamber 42 and the strength of the material from which the injector 90 is fabricated. Thus the value of the wall thickness is not based on the reception of the injector 90 in the shield 66. The value of the diameter d is related primarily to the gas flow rate of the process gas to be admitted to the chamber 42. Thus, the value of the diameter d is not based on the reception of the injector 90 in the shield 66. The injector 90 is also shown configured with external diameters D1 and D2. The difference between diameter D2 and diameter D1 defines the radial extent of the second shoulder 96. This radial extent is based on the configuration of a cylindrical spacer 104 and of an O-ring 106, which seal the injector 90 to the port 50. Thus, the value of the diameter D2 is not based on the reception of the injector 90 in the shield 66, and instead may be based on characteristics required for adequate sealing of the injector to the port.

In FIG. 4C the injector 90 is shown extending out of (above) the port 50. The injector 90 also extends into the cylindrical shield member, which may conform to the shield member 68 of the shield 66 described with respect to FIGS. 3A through 3D, or with respect to FIGS. 4A through 4D.

Thus, the shield member 68 may be configured to extend in the direction of the X axis to protect a process gas injector region 100 (FIG. 4B) from the electric field 62 (FIG. 2B) that is generated adjacent to the port 50 in the process chamber window 48. The process gas injector region 100 is identified in FIG. 4B by dash dot lines that represent a cylindrical region surrounding the injector 90. The term "substantially" is used in relation to the configuration of the port 50 with the slot 86 extending into the window 48, described as extending about ⅔ of the thickness T into the window. This term is also used in relation to the extension 78E of the cylindrical shield member 68 that is received in the slot 86 and that may also extend into the window 48 about ⅔ of the thickness T. The extension 78E thus surrounds all of the axial extent of the injector 90 between the second shoulder 96 and the end 99 of the injector 90, except for an axial length shown in FIG. 4D and identified by bracket L. Length L corresponds to about ⅓ of the window thickness T. With the thickness T in the above-described range, the value of ⅓ T is about ⅓ inch to about ⅔ inch. When the injector 90 has an exemplary total length of about 4.5 inches between the second shoulder 124 and the end 99, this value of ⅓ T represents very low percent of from about 7.7% to about 15% of that total length of the injector 90. As a result, with the extension 78E surrounding all of the injector 90 between the shoulder 96 and the end 88, and the section 80 of the shield surrounding all of the injector 90 outside of the port 50, the shield 66 is properly said to surround substantially all of the injector 90. Because the value of the length L of the injector 90 (that is not surrounded by the shield 66) is based on the maximum allowable depth (the exemplary ⅔ T) of the slot 86 that is required to maintain the structural integrity of the exemplary ceramic window 48, the injector diameter D2 is not based on the reception of the injector 90 in the shield 66 The port 50 is thus configured to receive a portion of the process gas injector region 100 (corresponding to the extent in the X direction by which the injector 90 overlaps the port 50).

Referring to FIGS. 4A and 4B, the shield 66 may be inserted into the port 50 after insertion of the axially short, cylindrical spacer 104 and the O-ring 106, both of which rest on the first sealing shoulder 92 of the port 50. Such first insertion of the spacer 104 and O-ring 106 may provide easy manual access to the first shoulder 92. Alternatively, if such manual access may be had via the shield 66, the shield may be inserted in the port before the spacer 104 and the O-ring 106. In either case, the tabs 84 may be used to move the respective arms 72 toward the X axis (FIG. 4A). The cylindrical member 68 of the shield 66 is then inserted into the port 50. In the embodiment shown in FIGS. 4A through 4D, the extension 78E is inserted into the slot 86 until the lower end 88 of the extension 78E rests on the bottom of the slot 86 (FIG. 4B). The tabs 74 are released and the foot 76 of each arm 72 easily enters the retainer groove 64 to retain the shield 66 in the port 50. In this manner, FIG. 4C shows that on insertion of the injector 90 into the port 50 with the respective end 99 of the injector 90 nearest to the chamber 42, the second sealing shoulder 96 of the injector 90 may rest on the O-ring 106. As shown in FIG. 4C, the O-ring 106 is in a non-deformed configuration. This resting is in contrast to a deformed configuration of the O-ring 106 shown in FIG. 4D, which is described below for sealing the injector 90 to the port 50.

For such sealing, the further configuration of each of the port 50, the shield 66, and the injector 90 may be appreciated by reference to FIGS. 4C and 4D. Each is configured to cooperate with the other and allow defining a diameter D3 of the port 50. Within the structural limits of the window 48, the port diameter D3 is based only on the sealing aspects of the second shoulder 96 and on the diameter d, both as described above. Further, the shield 66 may be as close as possible to the injector 90. For example, FIG. 4D shows a first annular space 102-1 defined between the extension 78E of the shield 66 and the port 50 when the injector 90 is received in the shield 66 and when the shield is mounted in the port 50. Further, FIG. 4D shows a second annular space 102-2 defined between the external cylindrical projection extension 80 of the injector 90 and the shield 66 when the injector 90 is similarly received in the shield 66.

Also for such sealing of the injector 90 and the port 50, FIG. 4B shows the exterior section 82 of the retainer arm 72 is configured from the projection extension 80 so that the exterior section 82 is exterior of the port 50 when the retainer foot 76 extends into the retainer groove 64. The exterior section 82 configured with the arm-position control tab 84 extending away from the longitudinal axis X facilitates the flexure of the flexure junction 74 even though the shield 66 is received in the port 50. Such flexure may be manual, for example, to move the retainer arm 72 toward the longitudinal axis X (FIG. 4B) and enable insertion of the shield 66 in the port 50.

The above description of FIG. 4B shows that the port 50 is configured to receive a portion of the process gas injector region 100 (corresponding to the extent in the X direction by which the injector 90 overlaps the port 50). The injector 90 is inserted into the port 50 after insertion of the spacer 104 and the O-ring 106, and after insertion of the shield 66. Both the spacer 104 and the O-ring 106 rest on the first sealing shoulder 92 of the port 50. FIG. 4C shows that on insertion of the injector 90 with the respective end 99 of the injector 90 nearest to the chamber 42, the second sealing shoulder 96 of the injector 90 rests on the O-ring 106 in the non-deformed configuration of the O-ring 106. This resting is in contrast to the deformed configuration of the O-ring 106 shown in FIG. 4D which results from the injector 90 being urged downward (as viewed in FIG. 4D) against a resistive force of the window 48. The description below indicates the structure of the shield 66 and the injector 90 by which such urging and resistive force may be applied to the O-ring 106 in the assembly of the injector 90 into the port 50 with the shield 66.

FIG. 4B shows the port 50 further configured with the port (or first) shoulder 92 adjacent to the retainer groove 64. The process gas injector region 100 is shown extending through the port 50 and is further configured with a subregion (identified by bracket 120, FIG. 4B). FIG. 4C shows a first seal distance S-1 corresponding to the subregion 120. The first seal distance S-1 extends from the first (port) shoulder 92 to the second shoulder 96. The first seal distance S-1 may also be described as an unsealed portion of the region 100, as defined by the subregion 120 and by the O-ring 106 in the uncompressed configuration (shown in FIG. 4C). A second seal distance S-2 is described as a sealed portion of the region 100 as defined by the shorter subregion 120 and by the O-ring 106 in the compressed configuration as shown in FIG. 4D.

For such sealing, FIG. 4A also shows the cylindrical exterior section 80 of the cylindrical shield member 68 configured with a closure end 122. FIG. 4C shows that the closure end 122 is spaced from each retainer foot 76 so that with the second sealing shoulder 96 resting loosely on the O-ring 106, the closure end 122 is positioned below the end 124 of the injector 90, the end 124 being adjacent to the closure end 122. With this configuration, FIG. 4C shows that the following results: (1) the retainer foot 76 is positioned by the flex junction 74 into, and is loose up and down in, the retainer groove 64 between the upper and lower sides of the groove 64, (2) the second shoulder 96 is resting on the O-ring 106, (3) the second shoulder 96 is not touching the spacer 104, and (4) the end 124 of the injector 90 is above the closure end 122 of the shield 66.

With this relative positioning of FIG. 4C in mind, FIG. 4D shows that a metal closure, or retainer, cover 126 may be secured to the closure end 122 of the shield 66 to continue the shielding effect of the shield 66 across the top of the shield 66. This securing is by screws 128 that pull the metal retainer cover 126 and the shield 66 together. When such pulling occurs, each foot 76 limits upward movement of the shield 66 because each foot 76 is in one of the retainer grooves 64. When the foot 76 engages the upper side of the groove 64, a downward force is applied to the injector end 124. FIG. 4D shows that the screws 128 are tightened to continue application of the downward force until the retainer cover 126 is flush against both of the closure end 122 and the injector end 124. At the time of that flush relationship, each foot 76 pulls upwardly on the top of the retainer groove 64 and the second sealing shoulder 96 has moved downwardly so that the sealing distance has shortened from the value S-1 to value S-2 as the O-ring 106 is deformed into the sealing configuration shown in FIG. 4D. At this time of value S-2, the second sealing shoulder 96 may be touching the spacer 104 to limit the deformation of the O-ring 106. The screws 128 are tightened to maintain the O-ring 106 in the deformed configuration, and each foot 76 retains the shield 66 and the injector 90 attached to the port 50 of the window 48. It may be understood from FIG. 4D that one of the screws 128 may be applied and tightened after connection of a conductor 130 to the metal retainer cover 126. The conductor 130 extends to a metal enclosure 132 of the apparatus 40. The enclosure 132 is electrically grounded.

It may be understood that the most-preferred embodiment of the present invention is shown in FIGS. 4A through 4D. In review, the shield 66 is shown for blocking the electric field 62 from all except the length L (FIG. 4D) of the process gas injector region 100 (FIG. 4A). In more detail, the cylindrical shield member 68 may be configured to extend in the direction of the X axis out of the port 50 of the window 48. The member 68 is configured with the cylindrical internal section 78E that is adapted to be co-extensive with the process gas injector region 100, except for the length L (FIG. 4D). The shield member 68 is also configured with the external cylindrical projection extension 80 extending in the direction of the axis X. The section 80 surrounds the entire length of the region 100 exterior of the port 50 (identified by bracket 80, FIG. 4D). The injector 90 may be configured from ceramic, and may have an overall length of about 4.5 inches and with the diameter d of the gas bore 94 of about 0.5 inches, for example.

As defined by the embodiments of the shield 66 shown in FIGS. 3A and 4A, the facilities 54 of the present invention may further be described in reference to HG. 3C, which shows the slot 70 configured with parallel portions 108 each having an end 110. The portions 108 extend parallel to the X axis. The ends 110 are opposed to each other, and the slot is further configured with a transverse slot section 112 connected to each of the opposed ends 110 of the parallel portions 108 of the slot 70. The slot 70 is further configured to interrupt eddy current flow induced by the electric field 62, which configuration is according to the width of the slot 70 and the axial length of each portion 108.

The injectors 90 may supply process or other gas through the port 50 into the chamber 42. The gases may be as described in the co-owned U.S. Pat. No. 6,230,651 identified and incorporated by reference above. Similarly, suitable structural features of the chamber 42, gas supply 56, coil 60, and energy source 58 may be provided as described in such U.S. Pat. No. 6,230,561. Additionally, such gases, suitable structural features of the chamber 42, gas supply 56, coil 60, and energy source 58 other than the features of the port 50, the shield 66, and the injector 90 of the present invention, may be as provided in a Model Kiyo 45 machine marketed by the assignee Lam Research Corporation.

In review, it may be understood that the above-described needs are met by the present invention in which the apparatus 40 is an electric field protection apparatus for the process chamber 42. The electric field 62 is generated adjacent to the region 52 or 100 defined by the cylindrical port 50 configured in the window 48 of the chamber 42. The above description of the embodiments of the present invention, including the embodiments of FIGS. 4A through 4D, indicates that the sealing of the injector 90 to the port 50 is accomplished by each of the injector 90, the port 50, and the shield 66 configured to cooperate with the other. Such cooperation allows defining of the diameter D3 of the port 50. Within the structural limits of the window 48, the diameter D3 is based only on the sealing aspects of the second shoulder 96 and on the diameter d, both as described above. Such sealing is also provided with the above-described shield 66 being as close as possible to the injector 90, e.g., via the first annular space 102-1 and second annular space 102-2. Such close spacing results from minimum values of the clearance spaces 102-1 and 102-2. The minimum values are possible in view of the arms 72 being configured to be free to move toward the X axis for insertion and return to the normal diameter of the cylindrical shield member 68 before the injector 90 need be inserted into the shield 66 (FIG. 4B). Also, the injector 90 is configured with the diameter D2, which is not based on the reception of the injector 90 in the shield 66. Further, the extension 78E does not move radially and may have a diameter no greater than that required to receive the injector 90. Similarly, the diameter D3 of the port 50 may have a value no greater than that required to receive the shield 66. In view of these factors that allow reduction of the diameter D3 of the port 50, the diameter D3 may be in a range of about one to three inches, and is more preferably in a range of about two to 1.5 inches, and is most preferably about 1.3 to two inches, for example. In more detail, the configuration of the shield 66 with each arm 72 having a retainer foot 76 allows the diameter D3 of the port 50 to be more than the injector diameter D2 by only the wall thickness of the shield 66 and one clearance space 102-2.

These configurations of the port 50, the shield 66, and the injector 90 cooperate to allow the shield to be as close as possible to the injector and the assembled shield and injector to be as far as possible from the coil 60. Such configuration of the diameter D3 of the port 50, while allowing receipt of the easily insertable and removable shield 66 having the configuration to surround substantially all of the injector 90, also retains the structural integrity of the window 48 against the low pressure in the chamber 42. That low pressure may be in the milliTorr range, for example.

Additionally, the above-described shield configuration provides the needed increased ease of removability and insertion of the shield 66, and better retention of the shield in the port 50 of the window 48. Also, there is ease of the sealing in that the retaining of the injector 90 via the foot 76 on each arm 72, and the use of the cover 126, also serve to effect the sealing. Additionally, the dual function of the slots 70 of the shield 66 as an eddy current suppressor and as defining the arms 72, reduces the structure required and assists in allowing the shield to be as close as possible to the injector and the assembled shield and injector to be as far as possible from the coil 60. Also, with the port diameter D3 as described above, the advantages described above are realized with less risk of weakening of the window. In addition, the proximity of the cover 126 to the enclosure 132 facilitates the short path from the cover 126 to ground via the conductor 130.

Although the foregoing invention has been described in some detail for purposes of clarity of understanding, it will be apparent that certain changes and modifications may be practiced within the scope of the appended claims. For example and not limitation, while the shield member 68 has been described as being cylindrical, the shield 66, including the shield member 68 and extensions 78 and 78E, and the section 80, may be configured with other shapes. Those other shapes may be compatible with the configuration of the port 50, as one example. Also, exemplary shield configurations include square and oval. As a further example of changes and modifications that may be practiced within the scope of the appended claims, the slots 70 need not be evenly-spaced around the shield member 68, which may have any of the above-noted configurations. Thus, the slots 70 may be spaced at uneven intervals around the shield member 68 and configure the described arms 72, for example. Such spacing may be according to the configuration of the coil 60 with which the shield 66 is used, for example. As a further example of changes and modifications that may be practiced within the scope of the appended claims, the configurations of the slots 70 may be other than the specifically-noted U-shape. For example, the slots 70 may be configured to define a V-shape arm 72, or may have another configuration that enables the flexure junction 74 to be defined and the foot 76 to be supported on the arm. As a further example of changes and modifications that may be practiced within the scope of the appended claims, one or more of the slots 70 may be provided in the shield member 68 for purposes other than retaining the shield 66 in the port 50. For example, one or more additional slots may be provided in the member 68 and configured to interrupt eddy current flow induced by the electric field 62. The configuration of these slots is with a slot width, axial length, and location to interrupt eddy current flow induced by the electric field 62.

Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A shield for protecting an access region of a process chamber window from an electric field that is generated adjacent to the process chamber window, the access region being defined by a port configured with a retainer groove on the sidewall of the port, the shield comprising:
   a shield member fabricated from material adapted to substantially block the electric field from entering the access region of the process chamber window, wherein the access region is defined by the port that is configured with the retainer groove on the sidewall of the port, the shield member having a longitudinal axis, the shield member being configured to substantially surround the access region and further being configured with a longitudinally-extending slot defining a retainer arm being parallel to the longitudinally-extending slot and a flexure junction between the retainer arm and the shield member, wherein the longitudinally-extending slot is an opening and defines a U-shape, and wherein the retainer arm is within the U of the U-shape and the flexure junction is at the open end of the U of the U-shape, the retainer arm having a retainer foot and an arm-position control tab, the flexure junction being configured to normally position the retainer arm away from the longitudinal axis to adapt the retainer foot to extend into the retainer groove by using the arm-position control tab upon insertion of the shield member into the port, the flexure junction being further configured to permit movement of the retainer arm toward the longitudinal axis to adapt the retainer foot to move out of the retainer groove by using the arm-position control tab to permit removal of the shield member from the port, wherein the arm-position control tab is external to the port to facilitate manual flexure of the flexure junction to adapt the retainer foot to extend into and to move out of the retainer groove.

2. A shield as recited in claim 1, wherein:
   the slot is a first slot, the arm is a first arm and the flexure junction is a first flexure junction; and
   the shield member is further configured with at least one other longitudinally-extending slot to define at least one other retainer arm and at least one other flexure junction between the at least one other retainer arm and the shield member, the at least one other arm and the at least one other flexure junction being respectively configured corresponding to the respective first arm and first flexure junction.

3. A shield as recited in claim 1, wherein:
   the shield member is further configured with a plurality of the longitudinally-extending slots, each of the slots defining one of the arms and one of the flexure junctions and one of the retainer feet; and
   the shield member is further configured with the longitudinally-extending slots spaced around a perimeter of the shield.

4. A shield as recited in claim 3, wherein there are 3 longitudinally-extending slots.

5. A shield for protecting a process gas injector region from an electric field that is generated adjacent to a port in a process chamber window, the port being configured to receive a portion of the process gas injector region, the port being further configured with a shield retainer groove on the sidewall of the port, the shield comprising:
   a shield member fabricated from material adapted to substantially block the electric field from entering the process gas injector region, wherein the port is configured to receive a portion of the gas process injector region and the port is further configured with the shield retainer groove on the sidewall of the port, the shield member having a longitudinal axis, the shield member being configured to substantially surround the process gas injector region and being further configured with a continuous slot defining a retainer arm extending parallel to the longitudinal axis and defining a flexure junction between the retainer arm and the shield member, wherein the continuous slot is an opening and defines a U-shape, and wherein the retainer arm being configured within the U of the U-shape and the flexure junction is at the open end of the U of the U-shape, the retainer arm having a retainer foot and an arm-position control tab, the flexure junction being configured to permit movement of the retainer arm toward the longitudinal axis to adapt the retainer foot to extend into the shield retainer groove by using the arm-position control tab to allow insertion of the shield member into the port, the flexure junction being further configured to normally position the retainer arm away from the longitudinal axis to adapt the retainer foot of the inserted shield member to extend into the shield retainer groove by using the arm-position control tab, the configuration of the flexure junction permitting movement of the retainer arm toward the longitudinal axis being effective to further adapt the retainer foot to move out of the shield retainer groove and permit removal of the shield member from the port, wherein the arm-position control tab is external to the port to facilitate manual flexure of the flexure junction to adapt the retainer foot to extend into and to move out of the shield retainer groove.

6. A shield as recited in claim 5, wherein:

the continuous slot is configured with parallel portions each having an end and extending parallel to the longitudinal axis, the ends being opposed to each other, the continuous slot being further configured with a transverse slot section connected to each of the opposed ends of the parallel portions of the continuous slot, the slot being further configured to interrupt eddy current flow induced by the electric field.

7. A shield as recited in claim 5, wherein:

the shield member is further configured with a plurality of continuous slots each defining one of the arms and one of the flexure junctions and one of the retainer feet.

8. A shield as recited in claim 7, wherein:

the respective plurality of continuous slots are spaced around a perimeter of the shield.

9. A shield as recited in claim 5, wherein:

the shield member is further configured with a plurality of the continuous slots, the slots being spaced around a perimeter of the shield.

10. A shield as recited in claim 9, wherein there are 3 continuous slots.

* * * * *